(12) United States Patent
Iikawa et al.

(10) Patent No.: US 6,552,671 B2
(45) Date of Patent: Apr. 22, 2003

(54) BRUSH ENCODER WITH RESILIENT CONTACT STRIPS

(75) Inventors: Makoto Iikawa, Saitama (JP); Masao Matsuzaki, Saitama (JP); Masashi Takahashi, Saitama (JP)

(73) Assignee: Pentax Corporation, Tokyo (JP)

( * ) Notice: Subject to any disclaimer, the term of this patent is extended or adjusted under 35 U.S.C. 154(b) by 0 days.

(21) Appl. No.: 10/025,613

(22) Filed: Dec. 26, 2001

(65) Prior Publication Data
US 2002/0080049 A1 Jun. 27, 2002

(30) Foreign Application Priority Data

Dec. 27, 2000 (JP) .......................................... 2000-396724

(51) Int. Cl.$^7$ ................................................ H03M 1/22
(52) U.S. Cl. ......................................... 341/16; 396/268
(58) Field of Search ............................ 341/16; 396/377, 396/79, 268

(56) References Cited

U.S. PATENT DOCUMENTS

| | | | | |
|---|---|---|---|---|
| 4,697,901 A | * | 10/1987 | Wakabayashi et al. | 396/377 |
| 5,428,355 A | * | 6/1995 | Jondrow et al. | 341/20 |
| 6,263,163 B1 | | 7/2001 | Sasaki et al. | 396/79 |

* cited by examiner

Primary Examiner—Peguy JeanPierre
(74) Attorney, Agent, or Firm—Greenblum & Bernstein, P.L.C.

(57) ABSTRACT

A brush encoder includes a coding-plate support member, to which a coding plate is fixed, and a brush support member, to which a brush is fixed, the brush having a base portion and resilient contact strips. The brush support member includes a support surface to which the base portion of the brush is mounted; at least one through slot through which the resilient contact strips of the brush extend to come in sliding contact with the coding plate; and a fulcrum portion, which contacts the base portion of the brush in the vicinity of a border between the base portion and the resilient contact strips, so as to serve as a fulcrum about which the brush is biased to rotate in a direction to make the base portion contact the support surface when the resilient contact strips are pressed against the coding plate.

11 Claims, 4 Drawing Sheets

BRUSH ENCODER WITH RESILIENT CONTACT STRIPS

BACKGROUND OF THE INVENTION

1. Field of the Invention

The present invention relates to a brush encoder that is widely used as a position detector for detecting a relative position between two members, one of which moves relative to the other, and more specifically relates to a fixing structure of a brush of the brush encoder.

2. Description of the Related Art

A photographing lens is often provided therein with a brush encoder to detect a focal length or a photographing distance. For instance, one of two members of the photographing lens (e.g., two rotational barrels), one of which moves relative to the other, serves as a brush support member which supports a brush of the brush encoder while the other member serves as a coding-plate support member which supports a coding plate of the brush encoder so that resilient contact strips of the brush come in sliding contact with the coding plate. The number of the resilient contact strips (i.e., the number of conductive segments of the coding plate) depends on the number of pieces of positional information needed for the two members.

In such a conventional brush encoder, the resilient contact strips are brought into pressing contact with the coding plate by fixing the base portion of the brush to the brush support member with a set screw or an adhesive.

Accordingly, in such a conventional brush encoder, a fixing member and a fixing procedure are required to fix the brush to the brush support member. In addition, if the fixing member comes off, the brush also comes off, which causes a loss of the operation of the brush encoder.

SUMMARY OF THE INVENTION

An object of the present invention is to provide a brush encoder in which no fixing member for fixing the brush to the brush support member is necessary. Another object of the present invention is to provide a brush encoder in which there is no possibility of the brush coming off even if the fixing member, via which the brush is fixed to the brush support member, comes off in the case of using a fixing member.

To achieve the object mentioned above, according to an aspect of the present invention, a brush encoder is provided, including a coding-plate support member to which a coding plate is fixed; and a brush support member, movable relative to the coding-plate support member, to which a brush is fixed, the brush having a base portion and resilient contact strips extending from the base portion, the contact strips being in sliding contact with the coding plate. The brush support member includes a support surface to which the base portion of the brush is mounted; at least one through slot through which the resilient contact strips of the brush extend toward the coding-plate support member to come in sliding contact with the coding plate; and a fulcrum portion, which contacts the base portion of the brush in the vicinity of a border between the base portion and the resilient contact strips, so as to serve as a fulcrum about which the brush is biased to rotate in a direction to make the base portion contact the support surface when the resilient contact strips are pressed against the coding plate so as to be elastically deformed thereby.

Preferably, the at least one through slot includes a plurality of through slots through which the resilient contact strips of the brush extend toward the coding-plate support member, respectively. The fulcrum portion includes at least one groove in which an end of the base portion which is adjacent to the resilient contact strips is partly inserted.

Preferably, the at least one groove of the fulcrum portion is formed on the brush support member at a position corresponding to a substantially center of the plurality of through slots in a direction perpendicular to a longitudinal direction of the plurality of through slots.

In an embodiment, the coding-plate support member is formed as a first ring-shaped member, and the brush support member is formed as a second ring-shaped member, wherein the coding plate is fixed to a peripheral surface of the first ring-shaped member.

In an embodiment, the coding-plate support member is formed as a first ring-shaped member, and the brush support member is formed as a second ring-shaped member, wherein the coding plate is fixed to an outer peripheral surface of the first ring-shaped member; and the support surface, to which the base portion of the brush is mounted, is formed on an outer peripheral surface of the second ring-shaped member.

In an embodiment, the coding-plate support member is formed as a first ring-shaped member, and the brush support member is formed as a second ring-shaped member, wherein the coding plate is fixed to an end face of the first ring-shaped member. The support surface, to which the base portion of the brush is mounted, is formed on an end face of the second ring-shaped member, and extends radially inwards.

Preferably, the brush support member further includes at least one protrusion which protrudes from the support surface; the at least one protrusion corresponding with at least one hole, in which the at least one protrusion is fitted, formed on the base portion of the brush.

Preferably, the base portion of the brush includes a bent portion at the end of the base portion.

According to another aspect of the present invention, a brush encoder is provided, including a coding plate having conductive traces formed in a predetermined pattern; a brush having resilient contact strips which come in sliding contact with the conductive traces of the coding plate, respectively; a coding-plate support member and a brush support member which move relative to each other, the coding plate and the brush being fixed to the coding-plate support member and the brush support member, respectively. The brush support member includes a support surface to which a base portion of the brush is mounted; through slots formed adjacent to the support surface to extend parallel to each other in a longitudinal direction of the coding plate, the resilient contact strips of the brush extend toward the coding-plate support member through the through slots to come into sliding contact with the conductive traces, respectively; and at least one insertion slot which is formed between the base portion and the through slots and in which an end of the base portion which is adjacent to the resilient contact strips is partly inserted. The brush is biased to rotate about the at least one insertion slot in a direction to make the base portion contact the support surface when the resilient contact strips are pressed against the coding plate so as to be elastically deformed thereby.

The present disclosure relates to subject matter contained in Japanese Patent Application No.2000-396724 (filed on Dec. 27, 2000) which is expressly incorporated herein by reference in its entirety.

BRIEF DESCRIPTION OF THE DRAWINGS

The present invention will be described below in detail with reference to the accompanying drawings in which.

DESCRIPTION OF THE PREFERRED EMBODIMENTS

Figure 1:
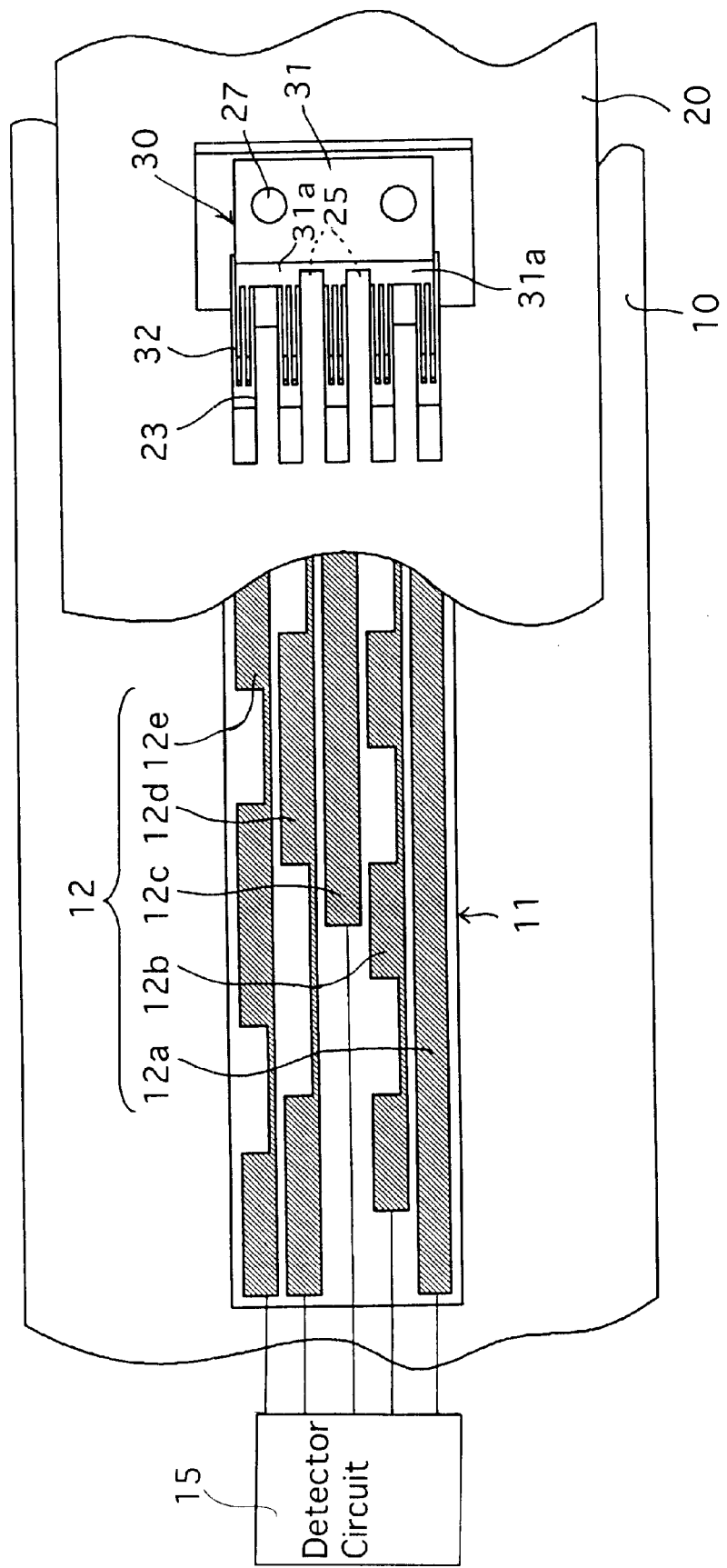
FIG. 1 is a fragmentary developed view of two coaxially-arranged barrels, one of which rotates relative to the other, showing the first embodiment of a fixing structure of a brush of a brush encoder according to the present invention.

FIGS. 1 through 6 show a fixing structure for a brush of a brush encoder of the first embodiment, according to the present invention. The brush encoder includes a coding plate 11 and a brush 30 which are fixed to a coding-plate support barrel (coding-plate support member/first ring-shaped member) 10 and a brush support barrel (brush support member/second ring-shaped member) 20, respectively. The coding-plate support barrel 10 is fitted in the brush support barrel 20 so that the two barrels 10 and 20 are coaxially arranged to be rotatable relative to each other about a common axis. The coding plate 11 is attached to an outer peripheral surface of the coding-plate support barrel 10, and is provided with a four-bit code pattern 12. The code pattern 12 consists of five conductive traces (patterns) (12a through 12e) which extend in a circumferential direction of the coding-plate support barrel 10 (the horizontal direction as viewed in FIG. 1). The five conductive traces include a ground trace 12a and four non-ground traces 12b, 12c, 12d and 12e. The brush 30 that is supported by the brush support barrel 20 is made of a conductive metal, and comes in contact with the code pattern 12.

Figure 2:
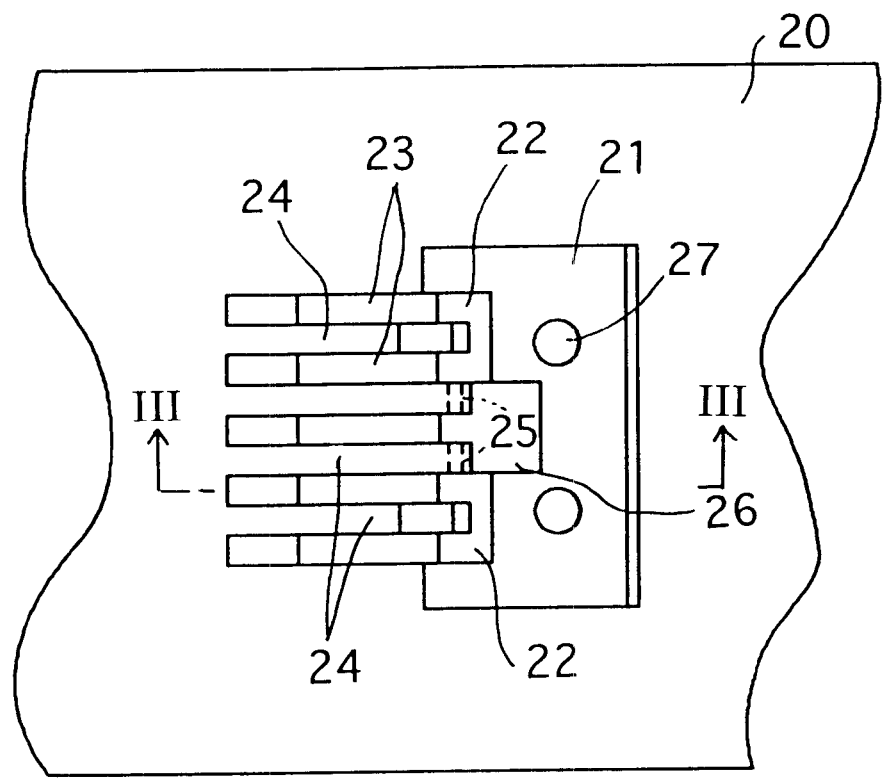
FIG. 2 is a fragmentary developed view of the brush support barrel shown in FIG. 1 in a state where the brush is removed from the brush support barrel.
Figure 3:
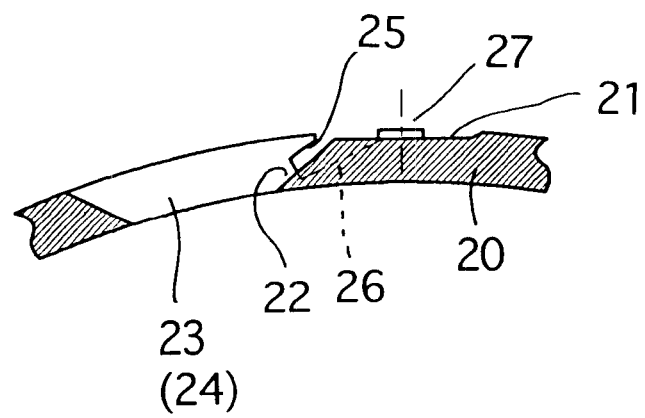
FIG. 3 is a cross sectional view taken along III—III line shown in FIG. 2.
Figure 4:
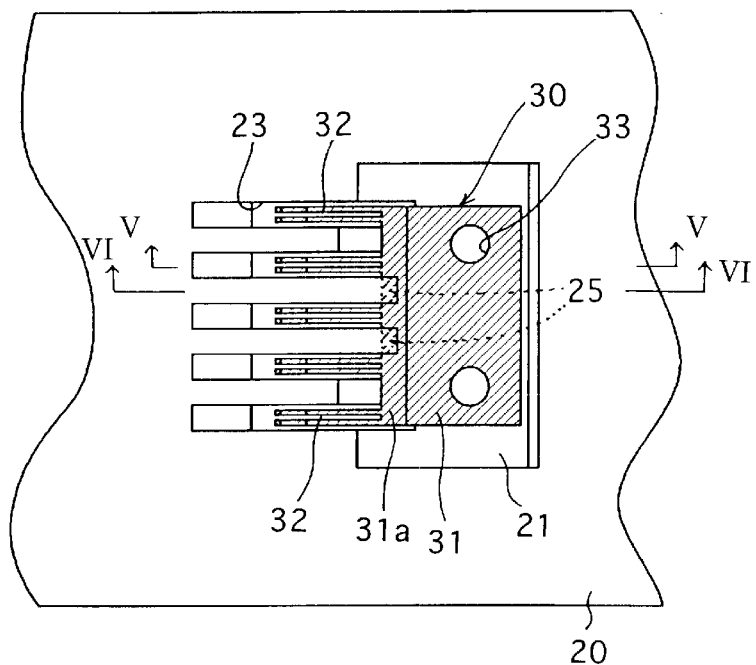
FIG. 4 is a fragmentary developed view of the brush support barrel and the brush shown in FIG. 1 in a state where the brush is fixed to the brush support barrel.
Figure 5:
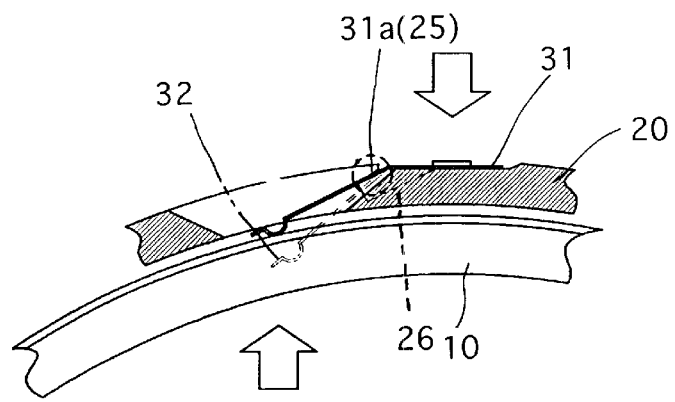
FIG. 5 is a cross sectional view taken along V—V line shown in FIG. 4.
Figure 6:
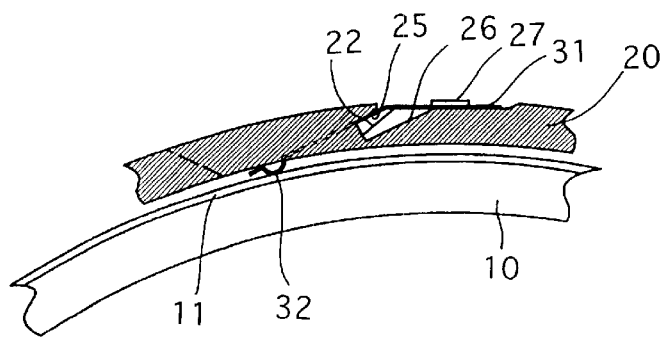
FIG. 6 is a cross sectional view taken along VI—VI line shown in FIG. 4.

The brush support barrel 20 is provided on an outer peripheral surface thereof with a flat support surface 21 which is slightly recessed toward the inside of the brush support barrel 20 (see FIGS. 2 and 3). The brush support barrel 20 is further provided, adjacent to the flat support surface 21 on an outer peripheral surface of the brush support barrel 20, with five through slots 23 which extend parallel to each other in a circumferential direction of the brush support barrel 20 to correspond to the five conductive traces (12a through 12e) of the code pattern 12. The brush support barrel 20 is provided between the flat support surface 21 and the five through slots 23 with an inclined surface 22 via which the flat support surface 21 is communicatively connected with the five through slots 23.

The brush support barrel 20 is provided with four partitions 24, each of which is formed between two adjacent through slots 23. In other words, the brush support barrel 20 is provided with four partitions 24 so that the four partitions 24 and the five through slots 23 are alternately arranged. The brush support barrel 20 is provided, at one end (right end as viewed in each of FIGS. 1 through 4) of each of two central partitions (two inner partitions) 24 adjacent to the inclined surface 22 with a fulcrum groove (fulcrum portion/insertion slot) 25. Each of the two fulcrum grooves 25 extends substantially parallel to the inclined surface 22 as viewed in a direction parallel to the axial direction of the brush support member 20 (see FIG. 3) so that an insertion space in which the brush 30 is partly inserted is formed between the inclined surface 22 and the two fulcrum grooves 25. The brush support barrel 20 is provided between the flat support surface 21 and the inclined surface 22 with a deeply-recessed inclined surface 26 (see FIGS. 2 and 3) which extends in a range corresponding to the central two partitions 24 in the axial direction of the brush support barrel 20 (the vertical direction as viewed in FIG. 2). The depth of the deeply-recessed inclined surface 26 is greater than the depth of the flat support surface 21 in a radial direction of the brush support barrel 20. The brush support barrel 20 is provided on the flat support surface 21 with two positioning protrusions 27. The deeply-recessed inclined surface 26 is formed for the purpose of ensuring the sufficient strength of a mold (not shown) used for molding the brush support barrel 20.

The brush 30, which is made of a conductive metal, is provided with a base portion 31 which is mounted on the flat support surface 21, and five resilient contact strips 32 which extend toward the coding-plate support barrel 10 through the five through slots 23, respectively. The brush 30 is hatched in FIG. 4 to clarify the shape thereof. The base portion 31 is provided, at one end thereof adjacent to the five resilient contact strips 32, with a bent portion 31a (see FIGS. 4 and 5) which extends along the inclined surface 22. The five resilient contact strips 32 extend substantially parallel to a plane in which the bent portion 31a lies. One end of the bent portion 31a which is adjacent to the five resilient contact strips 32 is partly inserted in the two fulcrum grooves 25 (see FIG. 4). The two fulcrum grooves 25 serve as a fulcrum about which the brush 30 is biased to rotate in a direction to make the base portion 31 contact with the flat support surface 21 when the five resilient contact strips 32 are pressed against the coding plate 11 so as to be elastically deformed thereby. The base portion 31 is provided with two positioning holes 33 in which the two positioning protrusions 27 are respectively fitted.

The brush 30 having the above described structure can be fixed to the brush support barrel 20 easily without using any particular fixing member (fixing means) in a manner which will be hereinafter discussed. Firstly the five resilient contact strips 32 of the brush 30 are respectively inserted into the five through slots 23, subsequently the base portion 31 is positioned on the flat support surface 21 (the two positioning protrusions 27 are not yet fitted in the two positioning holes 33 at this stage), and subsequently the brush 30 is moved relative to the brush support barrel 20 so that one end of the bent portion 31a which is adjacent to the five resilient contact strips 32 partly slides into the two fulcrum grooves 25. Subsequently, the brush 30 is further moved until the two positioning protrusions 27 are respectively fitted in the two positioning holes 33. This completes the fixing operation of the brush 30. In this fixing-operation completion state, the base portion 31 of the brush 30 is primarily prevented from coming off the brush support barrel 20 since the bent portion 31a is partly inserted in the fulcrum grooves 25. In addition, if an elastic force is given to the brush 30 by making the five resilient contact strips 32 come into contact with the coding plate 11 that is fixed to the coding-plate support barrel 10, the fulcrum grooves 25 (wherein the bent portion 31a is supported by the fulcrum grooves 25) serve as a fulcrum about which the brush 30 is biased to rotate in a direction to make the base portion 31 contact with the flat support surface 21 (indicated by two arrows shown in FIG. 5). Accordingly, the brush 30 is securely supported by the brush support barrel 20 thereon without using any particular fixing member. The brush 30 can be firmly fixed to the brush support barrel 20 by a set screw to ensure the fixation of the brush 30 to the brush support barrel 20, nevertheless, the brush 30 does not come off even if the set screw comes off.

Each of the five conductive traces 12a through 12e is electrically connected to a detector circuit 15 (see FIG. 1). The detector circuit 15 determines whether each of the four non-ground conductive traces 12b, 12c, 12d and 12e is electrically connected to the ground trace 12a via the brush 30 (the five resilient contact strips 32) to obtain four-bit positional information to determine relative positional information of the coding-barrel support barrel 10 and the brush support barrel 20. This information is used as focal length information or object distance information in the case of a lens barrel.

Figure 7:
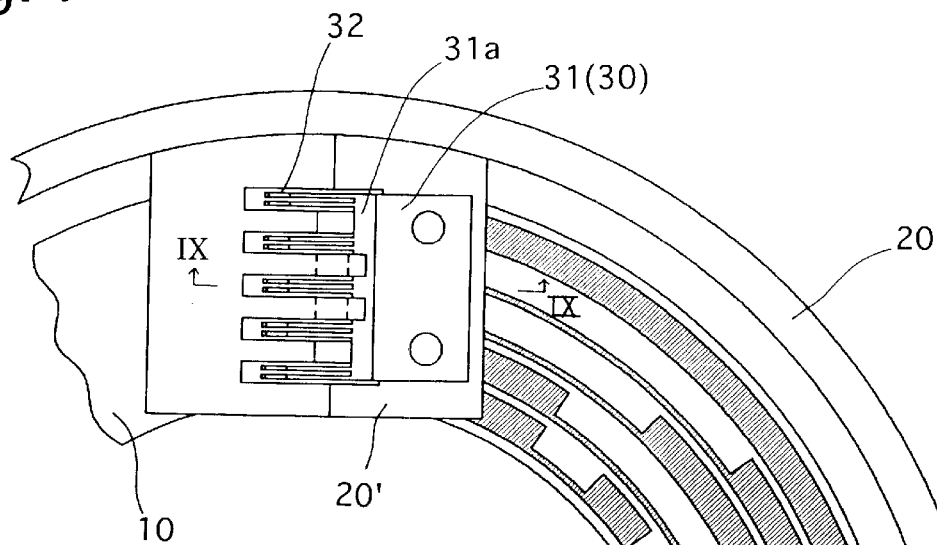
FIG. 7 is a fragmentary front elevational view of two coaxially-arranged barrels, one of which rotates relative to the other, showing the second embodiment of the fixing structure of the brush of the brush encoder according to the present invention.
Figure 8:
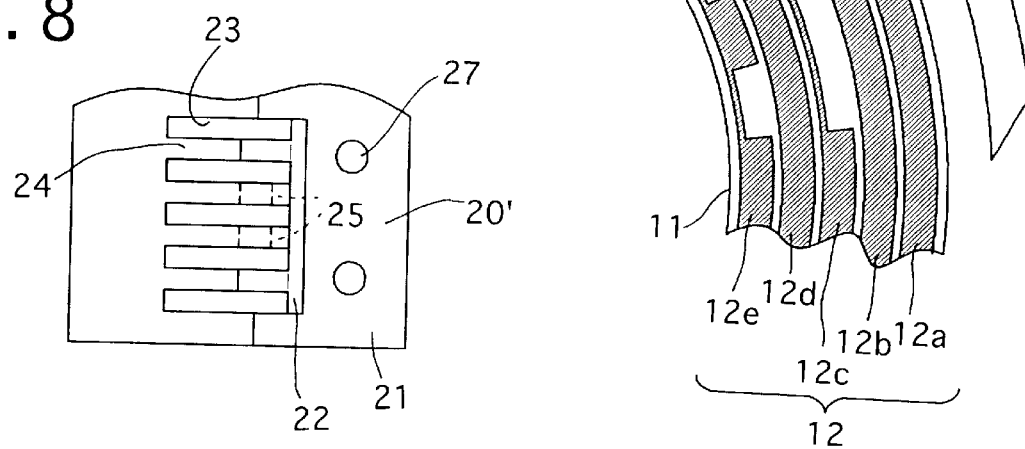
FIG. 8 is a fragmentary front elevational view of the brush support barrel shown in FIG. 7 in a state where the brush is removed from the brush support barrel.
Figure 9:
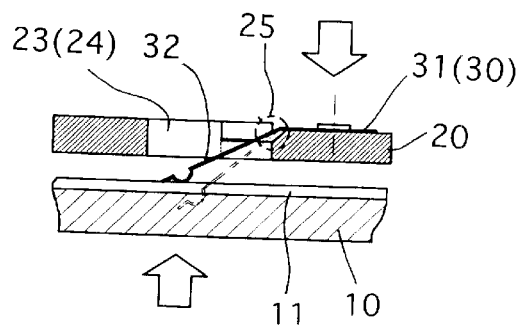
FIG. 9 is a cross sectional view taken along IX—IX line shown in FIG. 7.

FIGS. 7 through 9 show a fixing structure for a brush of a brush encoder of the second embodiment, according to the present invention. In this embodiment, parts similar to those in the first embodiment are designated by similar reference numerals. In this embodiment the coding plate 11 that is provided with the code pattern 12 has an arc shape so that the five conductive traces 12a, 12b, 12c, 12d and 12e are arranged coaxially, and the coding plate 11 is fixed to an end face of the coding-plate support barrel 10. The brush support barrel 20 is provided at a corresponding end thereof with a radial plate 20' which extends radially inwards. The brush 30 that comes in contact with the code pattern 12 of the coding plate 11 is fixed to the radial plate 20'. The remaining structure of the second embodiment is substantially identical to that of the first embodiment.

Although the coding-plate support barrel 10 and the brush support barrel 20 are barrels which rotate relative to each other, the present invention can also be applied to two members which linearly move relative to each other.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. A brush encoder comprising:
    a coding-plate support member to which a coding plate is fixed; and
    a brush support member, movable relative to said coding-plate support member, to which a brush is fixed, said brush having a base portion and resilient contact strips extending from the base portion, said contact strips being in sliding contact with said coding plate;
    said brush support member comprising:
        a support surface to which said base portion of said brush is mounted;
        at least one through slot through which said resilient contact strips of said brush extend toward said coding-plate support member to come in sliding contact with said coding plate; and
        a fulcrum, which contacts said base portion of the brush in the vicinity of a border between said base portion and said resilient contact strips, so as to serve as a pivot about which said brush is biased to bend in a direction so as to make said base portion contact said support surface when said resilient contact strips are pressed against said coding plate so as to be elastically deformed thereby.

2. The brush encoder according to claim 1, wherein said at least one through slot comprises a plurality of through slots through which said resilient contact strips of said brush extend toward said coding-plate support member, respectively;
    wherein said fulcrum portion comprises at least one groove in which an end of said base portion which is adjacent to said resilient contact strips is partly inserted.

3. The brush encoder according to claim 2, wherein said at least one groove of said fulcrum portion is formed on said brush support member at a position corresponding to a substantially center of said plurality of through slots in a direction perpendicular to a longitudinal direction of said plurality of through slots.

4. The brush encoder according to claim 2, wherein said base portion of said brush comprises a bent portion at said end of said base portion.

5. The brush encoder according to claim 1, wherein said coding-plate support member is formed as a first ring-shaped member, and said brush support member is formed as a second ring-shaped member,
    wherein said coding plate is fixed to a peripheral surface of said first ring-shaped member.

6. The brush encoder according to claim 1, wherein said coding-plate support member is formed as a first ring-shaped member, and said brush support member is formed as a second ring-shaped member;
    wherein said coding plate is fixed to an outer peripheral surface of said first ring-shaped member; and
    wherein said support surface, to which said base portion of said brush is mounted, is formed on an outer peripheral surface of said second ring-shaped member.

7. The brush encoder according to claim 1, wherein said coding-plate support member is formed as a first ring-shaped member, and said brush support member is formed as a second ring-shaped member,
    wherein said coding plate is fixed to an end face of said first ring-shaped member; and
    wherein said support surface, to which said base portion of said brush is mounted, is formed on an end face of said second ring-shaped member, and extends radially inwards.

8. The brush encoder according to claim 1, wherein said brush support member further comprises at least one protrusion which protrudes from said support surface; said at least one protrusion corresponding with at least one hole, in which said at least one protrusion is fitted, formed on said base portion of said brush.

9. The brush encoder according to claim 1, said fulcrum being positioned adjacent to said through slot.

10. The brush encoder according to claim 1, said fulcrum contacting said brush on a surface of said brush, an opposite surface of said brush contacting said coding plate.

11. A brush encoder comprising:
    a coding plate having conductive traces formed in a predetermined pattern;

a brush having resilient contact strips which come in sliding contact with said conductive traces of said coding plate, respectively;

a coding-plate support member and a brush support member which move relative to each other, said coding plate and said brush being fixed to said coding-plate support member and said brush support member, respectively;

wherein said brush support member includes:

a support surface to which a base portion of said brush is mounted;

through slots formed adjacent to said support surface to extend parallel to each other in a longitudinal direction of said coding plate, said resilient contact strips of said brush extend toward said coding-plate support member through said through slots to come into sliding contact with said conductive traces, respectively; and at least one insertion slot which is formed between said base portion and said through slots and in which an end of said base portion which is adjacent to said resilient contact strips is partly inserted;

wherein said brush is biased to rotate about said at least one insertion slot in a direction to make said base portion contact said support surface when said resilient contact strips are pressed against said coding plate so as to be elastically deformed thereby.

* * * * *